US012669697B2

(12) United States Patent
Hernandez et al.

(10) Patent No.: US 12,669,697 B2
(45) Date of Patent: Jun. 30, 2026

(54) CONTROL MODULE FOR INSPECTION TOOL

(71) Applicant: MILWAUKEE ELECTRIC TOOL CORPORATION, Brookfield, WI (US)

(72) Inventors: Francisco J. Hernandez, Brookfield, WI (US); Tyler A. Wahl, Brookfield, WI (US)

(73) Assignee: MILWAUKEE ELECTRIC TOOL CORPORATION, Brookfield, WI (US)

( * ) Notice: Subject to any disclaimer, the term of this patent is extended or adjusted under 35 U.S.C. 154(b) by 96 days.

(21) Appl. No.: 18/582,124

(22) Filed: Feb. 20, 2024

(65) Prior Publication Data

US 2024/0280799 A1 Aug. 22, 2024

Related U.S. Application Data

(60) Provisional application No. 63/485,989, filed on Feb. 20, 2023.

(51) Int. Cl.
*G02B 23/24* (2006.01)
*H05K 5/00* (2025.01)

(52) U.S. Cl.
CPC ....... *G02B 23/2476* (2013.01); *H05K 5/0017* (2013.01); *H05K 5/0086* (2013.01)

(58) Field of Classification Search
CPC .. G02B 23/16; G02B 23/2476; H05K 5/0017; H05K 5/0018; H05K 5/0086; A61B 1/00045
See application file for complete search history.

(56) References Cited

U.S. PATENT DOCUMENTS

| | | | |
|---|---|---|---|
| D332,059 S | 12/1992 | Kling et al. | |
| D375,695 S | 11/1996 | Narai | |

(Continued)

FOREIGN PATENT DOCUMENTS

| | | |
|---|---|---|
| AU | 200810038 | 5/2008 |
| CN | 308769559 | 8/2024 |

(Continued)

OTHER PUBLICATIONS

Roper, Chris. Xbox 360 Wireless Controller Tour. May 13, 2005. IGN. Retrieved from the Internet <URL: https://www.ign.com/articles/2005/05/13/xbox-360-wireless-controller-tour> (Year: 2005).*

(Continued)

*Primary Examiner* — James Wu
(74) *Attorney, Agent, or Firm* — Michael Best & Friedrich LLP

(57) ABSTRACT

A hand-held control module of an inspection tool includes a housing and a user interface supported by the housing and operable to control the inspection tool. The housing extends between a first side and a second side and includes a first surface at a bottom side thereof. The control module further includes a battery receptacle configured to receive a battery and a pair of grip protrusions each having a second surface inclined with respect to the first surface by a first angle. The hand-held control module is configured to be supported on a work surface in a reclined position in which the second surfaces engage the work surface.

18 Claims, 13 Drawing Sheets

(56) References Cited

U.S. PATENT DOCUMENTS

| | | | |
|---|---|---|---|
| D445,351 S | 7/2001 | Yamauchi et al. | |
| D498,492 S | 11/2004 | Miyauchi et al. | |
| 7,203,533 B1 * | 4/2007 | Tischer | H01Q 1/40 |
| | | | 455/575.8 |
| D568,773 S | 5/2008 | Hori | |
| D571,234 S | 6/2008 | Reeson et al. | |
| D573,044 S | 7/2008 | Kalis et al. | |
| D573,906 S | 7/2008 | Maki et al. | |
| D574,739 S | 8/2008 | Lee et al. | |
| D577,298 S | 9/2008 | Reeson et al. | |
| D578,906 S | 10/2008 | Gatz et al. | |
| D581,818 S | 12/2008 | Gretton | |
| D589,383 S | 3/2009 | Gretton | |
| D589,384 S | 3/2009 | Gretton | |
| D589,385 S | 3/2009 | Gretton | |
| D591,184 S | 4/2009 | Gretton | |
| D596,513 S | 7/2009 | Lammers-Meis et al. | |
| D606,432 S | 12/2009 | Winterhalter et al. | |
| D608,228 S | 1/2010 | Miyawaki | |
| D611,362 S | 3/2010 | Hansen et al. | |
| D611,366 S | 3/2010 | Register et al. | |
| D614,220 S | 4/2010 | Goldenberg | |
| D625,627 S | 10/2010 | McAlpine et al. | |
| D625,629 S | 10/2010 | McAlpine et al. | |
| 7,956,888 B2 | 6/2011 | Karpen | |
| D644,543 S | 9/2011 | Henne et al. | |
| D652,747 S | 1/2012 | Ferris | |
| 8,189,043 B2 | 5/2012 | Schneider et al. | |
| 8,310,533 B2 | 11/2012 | Morse et al. | |
| 8,368,749 B2 | 2/2013 | Lambdin et al. | |
| 8,460,182 B2 | 6/2013 | Ouyang et al. | |
| 8,523,764 B2 * | 9/2013 | Hatcher | A61B 1/0052 |
| | | | 600/146 |
| 8,863,033 B2 | 10/2014 | Domke et al. | |
| D729,643 S | 5/2015 | Browning et al. | |
| D729,644 S | 5/2015 | Browning et al. | |
| D730,213 S | 5/2015 | Emge et al. | |
| D742,258 S | 11/2015 | Stevens et al. | |
| D751,933 S | 3/2016 | Lenz et al. | |
| D764,328 S | 8/2016 | Lafrance et al. | |
| 9,433,339 B2 | 9/2016 | Allyn et al. | |
| 9,468,367 B2 | 10/2016 | Ouyang et al. | |
| 9,476,823 B2 | 10/2016 | Ward et al. | |
| 9,498,112 B1 | 11/2016 | Stewart et al. | |
| 9,538,677 B2 | 1/2017 | Coombs et al. | |
| 9,538,908 B2 | 1/2017 | Allyn et al. | |
| 9,581,438 B2 | 2/2017 | Messinger et al. | |
| 9,585,813 B2 | 3/2017 | Dorsey et al. | |
| 9,622,646 B2 | 4/2017 | Ouyang et al. | |
| D804,481 S | 12/2017 | Lim et al. | |
| D808,829 S | 1/2018 | Dempsey et al. | |
| D808,830 S | 1/2018 | Dempsey et al. | |
| D811,459 S | 2/2018 | Fang | |
| 9,895,048 B2 | 2/2018 | Ouyang et al. | |
| D826,742 S | 8/2018 | Lutz | |
| D827,829 S | 9/2018 | Meng | |
| D828,862 S | 9/2018 | Fang | |
| 10,131,042 B2 | 11/2018 | Mergener et al. | |
| 10,131,043 B2 | 11/2018 | Mergener et al. | |
| 10,213,908 B2 | 2/2019 | Mergener et al. | |
| 10,272,016 B2 | 4/2019 | Allyn et al. | |
| 10,278,563 B2 | 5/2019 | Ouyang et al. | |
| 10,290,206 B2 | 5/2019 | Messinger et al. | |
| 10,292,570 B2 | 5/2019 | Kronman et al. | |
| 10,292,571 B2 | 5/2019 | Ouyang et al. | |
| 10,359,620 B2 | 7/2019 | Ward et al. | |
| 10,362,926 B2 | 7/2019 | Ouyang et al. | |
| D855,738 S | 8/2019 | Doran | |
| 10,419,705 B2 | 9/2019 | Furuhata | |
| 10,441,134 B2 | 10/2019 | Ouyang et al. | |
| 10,524,636 B2 | 1/2020 | Ouyang et al. | |
| 10,569,398 B2 | 2/2020 | Mergener et al. | |
| D884,702 S | 5/2020 | Huang et al. | |
| 10,666,854 B2 | 5/2020 | Furuhata | |
| 10,670,538 B2 | 6/2020 | Morris | |
| 10,712,290 B2 | 7/2020 | Morris | |
| 10,869,592 B2 | 12/2020 | Ouyang et al. | |
| 10,874,287 B2 | 12/2020 | Ouyang et al. | |
| D907,097 S | 1/2021 | Suurmeijer et al. | |
| 10,967,489 B2 | 4/2021 | Mergener et al. | |
| 11,253,141 B2 | 2/2022 | Ouyang et al. | |
| 11,353,407 B2 | 6/2022 | Morris | |
| D956,591 S | 7/2022 | Yao | |
| 11,415,527 B2 | 8/2022 | Morris | |
| D1,022,720 S | 4/2024 | Zhang | |
| 12,036,467 B2 * | 7/2024 | Kong | A63F 13/24 |
| D1,054,406 S | 12/2024 | Koo | |
| D1,087,339 S | 8/2025 | Sun | |
| 2009/0105538 A1 | 4/2009 | Van Dam et al. | |
| 2012/0172665 A1 | 7/2012 | Allyn et al. | |
| 2014/0024895 A1 | 1/2014 | Allyn | |
| 2014/0094651 A1 | 4/2014 | Allyn et al. | |
| 2014/0094652 A1 | 4/2014 | Lewis et al. | |
| 2014/0094653 A1 | 4/2014 | Lewis et al. | |
| 2014/0276207 A1 | 9/2014 | Ouyang et al. | |
| 2014/0288460 A1 | 9/2014 | Ouyang et al. | |
| 2015/0150441 A1 | 6/2015 | Ouyang et al. | |
| 2015/0309640 A1 | 10/2015 | Vuckovic | |
| 2019/0125631 A1 | 5/2019 | Allyn et al. | |
| 2019/0231167 A1 | 8/2019 | Kronman et al. | |
| 2019/0333366 A1 | 10/2019 | Messinger et al. | |
| 2021/0093169 A1 | 4/2021 | Ouyang et al. | |
| 2021/0213594 A1 | 7/2021 | Mergener et al. | |

FOREIGN PATENT DOCUMENTS

| | | |
|---|---|---|
| JP | 2005023979 | 6/2006 |
| JP | 2007024160 | 6/2008 |
| JP | 2013003214 | 10/2013 |
| JP | D1665168 | 8/2023 |
| KR | 3020040039196 | 8/2005 |
| KR | 3020040041022 | 8/2005 |
| KR | 3020050027872 | 8/2006 |
| WO | 2013099305 A1 | 7/2013 |

OTHER PUBLICATIONS

Snap-On, "High Definition Borescope with 5.5 mm Dual Imager," <https://shop.snapon.com/product/Video-Scopes/High-Definition-Borescope-with-5.5-mm-Dual-Imager/BK7000> web page visited May 18, 2023 (2 pages).

Klein Tools, "ET17 Utility Borescope," <https://www.kleintools.com/catalog/borescopes/utility-borescope> web page visited Apr. 15, 2026 (4 pages).

Vevor, "VEVOR Borescope Camera, Triple Lens Endoscope Camera with Light, 4.5 Screen 1080P Inspection Camera with 10 LED Light, IP67 Waterproof Drain Snake Camera for Auto, Plumbing (16.5FT Cable, 32GB Card)," <https://www.vevor.com/pipe-inspection-camera-c_11031/vevor-endoscope-camera-borescope-inspection-camera-triple-lens-4-5-ips-p_010690827472> web page visited Apr. 15, 2026 (19 pages, best available copy).

* cited by examiner

CONTROL MODULE FOR INSPECTION TOOL

CROSS REFERENCE TO RELATED APPLICATIONS

This application claims priority to U.S. Provisional Patent Application No. 63/485,989, filed on Feb. 20, 2023, the entire contents of which are incorporated herein by reference.

FIELD

Embodiments described herein relate to control modules for inspection tools such as borescopes and specifically to hand-held control modules and the housings thereof.

SUMMARY

The present disclosure provides, in some embodiments, a hand-held control module of an inspection tool, the control module including a housing and a user interface supported by the housing and operable to control the inspection tool. The housing extends between a first side and a second side and includes a first surface at a bottom side thereof. The control module further includes a battery receptacle configured to receive a battery and a pair of grip protrusions each having a second surface inclined with respect to the first surface by a first angle. The hand-held control module is configured to be supported on a work surface in a reclined position in which the second surfaces engage the work surface.

The present disclosure provides, in some embodiments, a control module of an inspection tool, the control module including a housing extending between a first side and a second side, a battery receptacle disposed at a rear side of the housing and configured to receive a battery, and a user interface supported by the housing and operable to control the inspection tool. The housing includes a first surface at a bottom side thereof. The battery receptacle includes a second surface inclined with respect to the first surface by a first angle. The control module is configured to be supported on a work surface in a reclined position in which the second surface engages the work surface.

The present disclosure provides, in some embodiments, an inspection tool including a scope unit and a hand-held control module operable to control the scope unit. The hand-held control module includes a housing extending between a first side and a second side, a battery receptacle disposed at a rear side of the housing and configured to receive a battery, a pair of grip protrusions, and a user interface supported by the housing and configured to control the scope unit. The housing includes a first surface at a bottom side thereof. The battery receptacle includes a second surface inclined with respect to the first surface by a first angle. The pair of grip protrusions each include a third surface inclined with respect to the first surface by the first angle. The control module is configured to be placed on a work surface in a reclined position in which the second surface and third surfaces engage the work surface and the user interface is tilted backwards relative to vertical.

One or more embodiments are described and illustrated in the following description and accompanying drawings. These embodiments are not limited to the specific details provided herein and may be modified in various ways. Furthermore, other embodiments may exist that are not described herein. Also, the functionality described herein as being performed by one component may be performed by multiple components in a distributed manner. Likewise, functionality performed by multiple components may be consolidated and performed by a single component. Similarly, a component described as performing particular functionality may also perform additional functionality not described herein. For example, a device or structure that is "configured" in a certain way is configured in at least that way but may also be configured in ways that are not listed. Furthermore, some embodiments described herein may include one or more electronic processors configured to perform the described functionality by executing instructions stored in non-transitory, computer-readable medium. Similarly, embodiments described herein may be implemented as non-transitory, computer-readable medium storing instructions executable by one or more electronic processors to perform the described functionality. As used in the present application, "non-transitory computer-readable medium" comprises all computer-readable media but does not consist of a transitory, propagating signal. Accordingly, non-transitory computer-readable medium may include, for example, a hard disk, a CD-ROM, an optical storage device, a magnetic storage device, a ROM (Read Only Memory), a RAM (Random Access Memory), register memory, a processor cache, or any combination thereof.

In addition, the phraseology and terminology used herein is for the purpose of description and should not be regarded as limiting. For example, the use of "including," "containing," "comprising," "having," and variations thereof herein is meant to encompass the items listed thereafter and equivalents thereof as well as additional items. The terms "connected" and "coupled" are used broadly and encompass both direct and indirect connecting and coupling. Further, "connected" and "coupled" are not restricted to physical or mechanical connections or couplings and can include electrical connections or couplings, whether direct or indirect. In addition, electronic communications and notifications may be performed using wired connections, wireless connections, or a combination thereof and may be transmitted directly or through one or more intermediary devices over various types of networks, communication channels, and connections. Moreover, relational terms such as first and second, top and bottom, and the like may be used herein solely to distinguish one entity or action from another entity or action without necessarily requiring or implying any actual such relationship or order between such entities or actions.

Other aspects of the invention will become apparent by consideration of the detailed description and accompanying drawings.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting.

DETAILED DESCRIPTION

Borescopes and other similar inspection tools are used to access parts of machinery that are difficult to see or reach in order to inspect for damage, make repairs, etc. Borescopes may include a scope unit and a control module. The scope unit may include one or more image cameras, video cameras, other visual inspection devices, or other types of sensors. The one or more sensors are mounted on a flexible shaft capable of being shaped and maneuvered into tight spaces. The flexible shaft may be coupled to the control module at an end opposite the sensor(s). The image(s) or data obtained by the scope unit is transferred to the control module where the data may be analyzed, stored, communicated to a user, etc. Embodiments of control modules for an inspection tool are described herein.

Figures 1, 2:
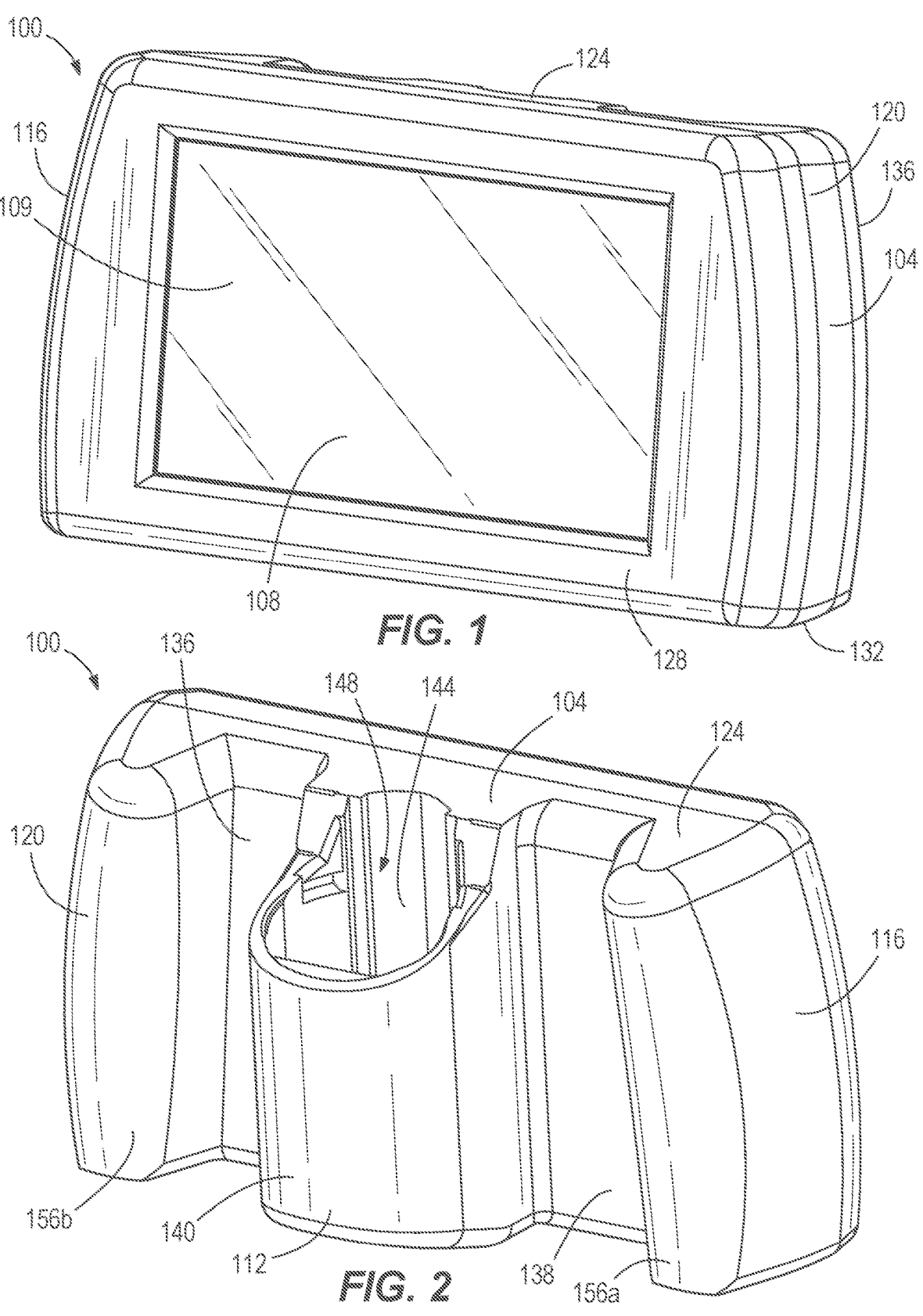
FIG. 1 is a front perspective view of a control module for a borescope.
FIG. 2 is a rear perspective view of the control module of FIG. 1.

FIGS. 1-5B illustrate a first embodiment of a control module 100. With reference to FIG. 1, the control module 100 includes a housing 104 supporting a user interface 108 and a plurality of electronic components configured to control an associated scope unit (not shown) based on input from the user interface 108. The control module 100, also referred to herein as support case 100, may be used by a user to support the user interface 108 relative to the user during operation. The control module 100 may be a hand-held control module 100 and may be supported above a work surface by the user. The control module 100 may also include features that support the case 100 on a work surface to enable the user to set the support case 100 down while operating the inspection tool. The control module 100 includes a battery receptacle 112 (FIG. 2) that removably receives and couples to a battery to power the electronic components. The battery may be a removable, rechargeable power tool battery. For example, the battery may be a 12-volt Li-ion battery pack. In other embodiments, the battery may have other voltages (e.g., 9-volts, 18-volts, etc.) and/or chemistries (e.g., Ni-MH, etc.). The housing 104 extends between a first side 116 and a second side 120, and includes a top side 124, a front side 128, a bottom side 132, and a rear side 136 extending between the first side 116 and the second side 120. The user interface 108 is supported by the housing 104 on the front side 128 thereof. The user interface 108 includes a display 109 which may be configured to display the data provided by the scope unit. In the illustrated embodiment, the user interface 108 includes a touch screen display having on-screen buttons that enable the user to control the inspection tool. In some embodiments, the user interface 108 may additionally include other control actuators (e.g., buttons, switches, etc.) positioned on the housing 104 for controlling the inspection tool. In such embodiments, the control actuators may be alternately or additionally positioned on sides or rear of the housing 104 (e.g., like a video-game controller).

The control module 100 is configured to be connected to the scope unit. In some embodiments, the control module 100 may wirelessly communicate with the scope unit or other accessories or external devices to transfer data therebetween. In such embodiments, the user interface 108 may send and receive signals using a wireless protocol, such as Bluetooth, Wi-Fi, or the like. For example, the user interface 108 may wirelessly receive video signals from the scope unit and may wirelessly send commands (e.g., power commands, lighting commands, pan/zoom/tilt commands, image capture commands, etc.) to the scope unit. In other embodiments, the control module 100 may also physically couple to the scope unit by wires or cords. Alternatively, the scope unit may directly connect to and extend from the control module 100 and may plug into a dedicated port on the control module 100. In such embodiments, the user interface 108 may send and receive signals to and from the scope unit through a wired connection. In further embodiments, the user interface 108 may send and receive signals to and from the scope unit using a combination of wireless and wired connections.

Figure 3:
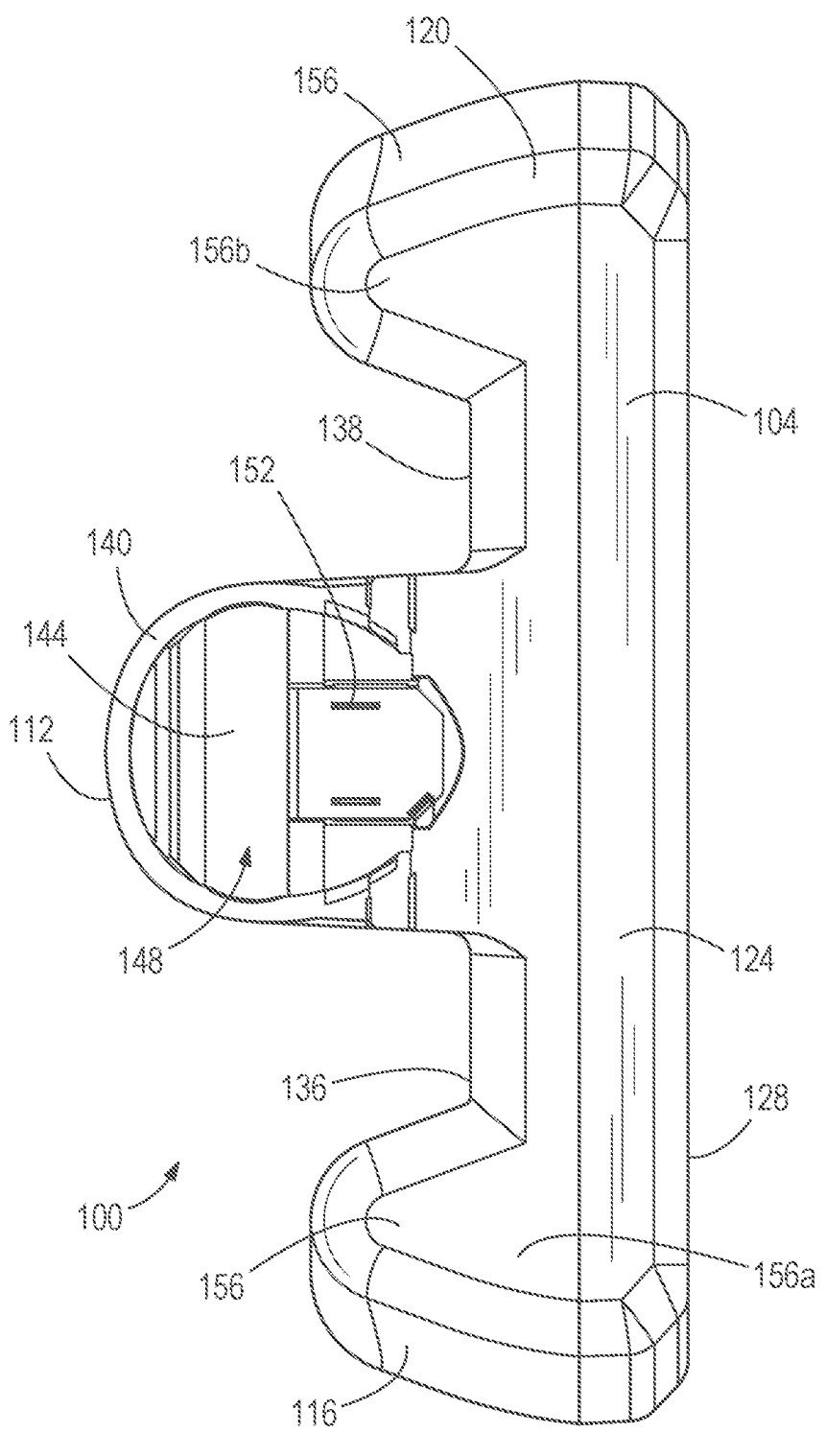
FIG. 3 is a top view of the control module of FIG. 1.

Turning to FIG. 2-3, the control module 100 includes a battery receptacle 112. In the illustrated embodiment, the battery receptacle 112 is positioned on the rear side 136 of the control module 100. The rear side 136 includes a rear surface 138 and a receptacle protrusion 140 that extends rearwardly from the rear surface 138 and defines the battery receptacle 112. The battery receptacle 112 includes a channel 144 for at least partially receiving the battery. The channel 144 is accessible from the top side 124 of the housing 104 through an opening 148. The battery receptacle 112 includes electrical contacts 152 (FIG. 3) positioned within the channel 144 that electrically couple the battery with the internal electronic components of the control module 100 when the battery is partially and/or fully received in the channel 144. In the illustrated embodiment, the battery receptacle 112 is centrally located between the first side 116 and the second side 120 of the control module 100. In other words, the battery receptacle 112 is generally disposed adjacent a middle of the rear side 136.

With continued reference to FIG. 2-3, the rear side 136 of the housing 104 further includes a pair of hand holds 156, also referred to herein as protrusions 156 or grip protrusions 156, extending rearwardly from the rear surface 138. The grip protrusions 156 are positioned on opposite sides of the receptacle protrusion 140. As shown best in FIG. 3, the receptacle protrusion 140 extends further rearward from the rear surface 138 than the pair of grip protrusions 156. In other embodiments, the grip protrusions 156 may extend further rearward from the rear surface 138 than the receptacle protrusion 140, or the receptacle and grip protrusions 140, 156 may extend generally the same distance from the rear surface 138. The pair of grip protrusions 156 includes a first protrusion 156a adjacent the first side 116 and a second protrusion 156b adjacent the second side 120. The pair of grip protrusions 156 are shaped to facilitate the user grasping one or both of the protrusions 156 in order to support the control module 100 with one or both hands while the user interacts with the user interface 108 (e.g., watches the display 109, presses buttons, etc.). In the illustrated embodiment, the grip protrusions 156 are generally shaped like rounded triangles. In other embodiments, the grip protrusions 156 may have other shapes. The grip protrusions 156 are shaped to be easy to hold and improve ergonomics of supporting the control module 100 to increase user comfort. The grip protrusions 156 may be shaped such that the user's hand surrounds a majority of an outer surface of the protrusion 156. In some embodiments, the housing 104 may only include a single grip protrusion 156. For example, the grip protrusion 156 may be positioned on one side of the housing 104, and the receptacle protrusion 140 may be positioned on an opposite side of the housing 104. In such embodiments, the receptacle protrusion 140 may also function as a second grip protrusion.

Figure 4:
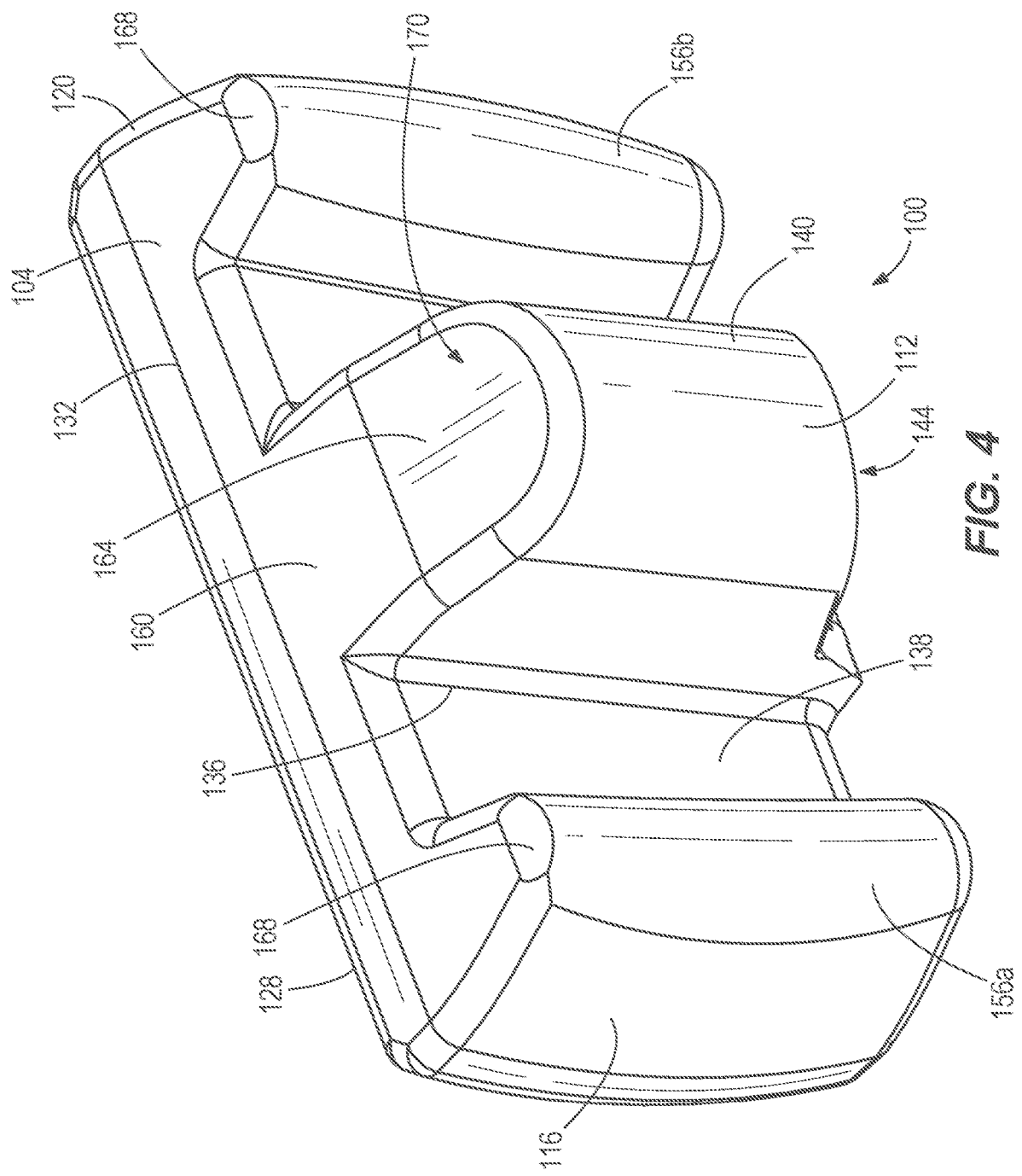
FIG. 4 is a bottom perspective view of the control module of FIG. 1.

With reference to FIG. 4, the bottom side 132 of the control module 100 includes a first surface 160 extending from the first side 116 to the second side 120 and a reclined surface 170. The first surface 160 is generally flat (e.g., planar) and extends at least partially under a portion of each of the pair of grip protrusions 156 and a portion of the receptacle protrusion 140. The receptacle protrusion 140 includes a second surface 164. The second surface 164 is angled or inclined with respect to the first surface 160 (for example, by a first angle α). The second surface 164 is under a rearmost portion of the receptacle protrusion 140 (i.e., a portion of the receptacle protrusion 140 furthest from the rear surface 138). The pair of grip protrusions 156 each include a third surface 168. The third surfaces 168 are similarly inclined or angled with respect to the first surface 160 (for example, by the first angle α). In the illustrated embodiment, each third surface 168 is adjacent the apex of the rounded triangle. The third surfaces 168 may be smaller than the second surface 164. Since the second surface 164 is positioned on the receptacle protrusion 140 and the third surfaces 168 are positioned on the grip protrusions 156, the second surface 164 is positioned between the pair of third surfaces 168. Specifically, the third surface 168 of the first protrusion 156a is spaced from the second surface 164 toward the first side 116. The third surface 168 of the second protrusion 156b is spaced form the second surface 164 toward the second side 120. In the illustrated embodiment, the second surface 164 and the third surfaces 168 are parallel and coplanar. The forward edge of the second surface 164 and the third surfaces 168 are aligned (e.g., are the same distances from the rear surface 138). Therefore, the second surface 164 and the third surfaces 168 cooperate to form the reclined surface 170.

Figures 5A, 5B:
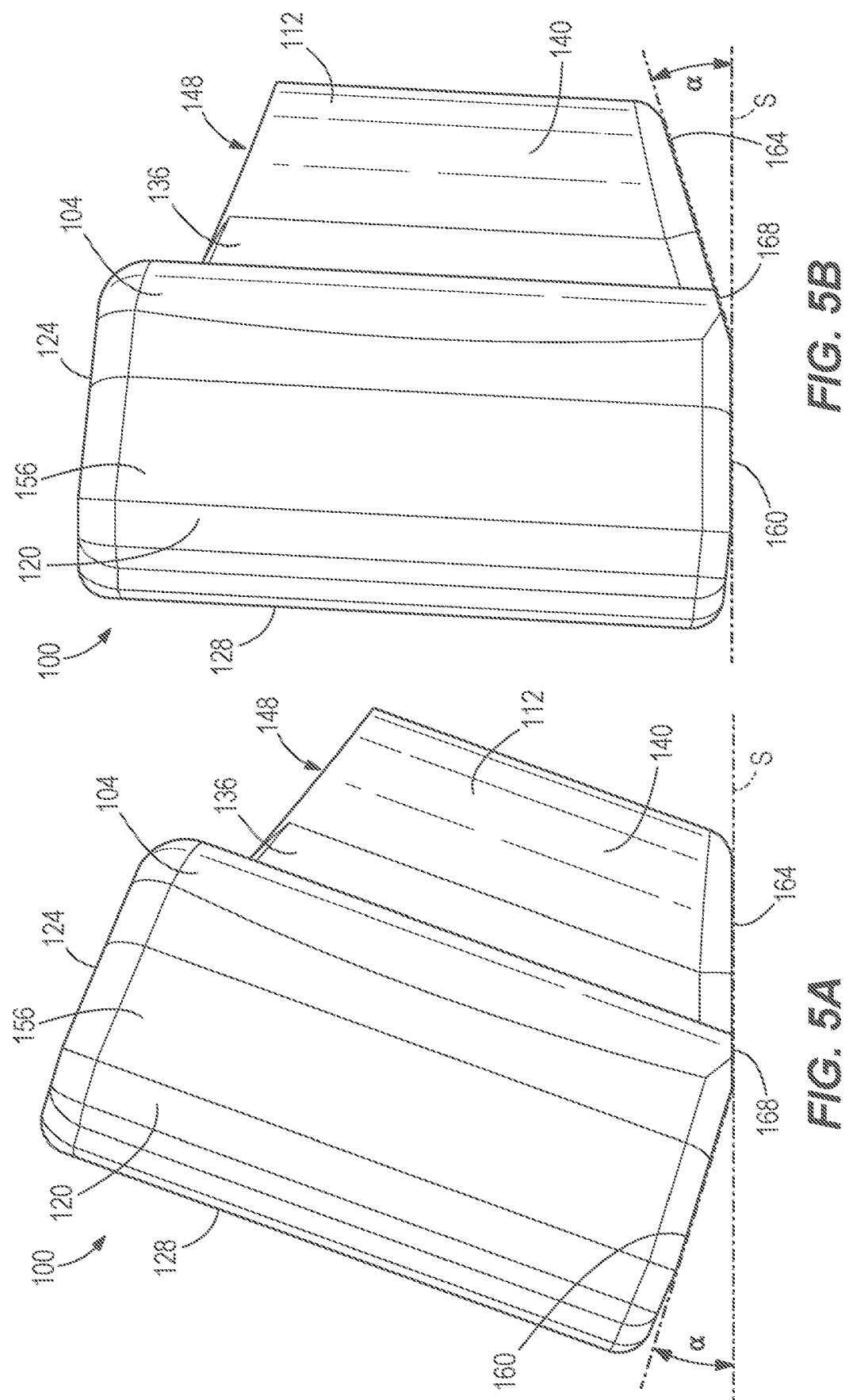
FIG. 5A is a side view of the control module of FIG. 1 in a first supported position.
FIG. 5B is a side view of the control module of FIG. 1 in a second supported position.

Turning to FIGS. 5A and 5B, the control module 100 may be rested on a work surface S, such as a ground, a tabletop, etc. When resting on the work surface S, it is desirable for the user interface 108 to remain easily visible or accessible to the user. Additionally, it is desirable for the control module 100 to be stable upon the work surface and to avoid tipping or falling. In embodiments where a scope unit or other components or accessories are connected to the control module 100 via cords, there may be pulling forces acting on the control module 100 which the control module 100 may need to withstand in order to avoid tipping or unwanted displacement.

As shown in FIG. 5A, the control module 100 may be positioned on the work surface S in a first or reclined position. In the reclined position, the control module 100 is supported by the reclined surface 170 and thus is oriented with the second surface 164 and the third surfaces 168 contacting or engaging the work surface S. In this orientation, the front side 128 of the control module 100 is tilted backward from vertical and is positioned at an acute angle to the work surface S supporting the control module 100. In other words, the front side 128, including the user interface 108, is facing upwards, increasing the visibility of the user interface 108. The third surfaces 168 are spaced from the second surface 164, creating a stable base by widening the support area of the reclined surface 170 to add stability to the control module 100. In some embodiments, the reclined surface 170 may omit the second surface 164 or the third surfaces 168. In such embodiments, the control module 100 may be supported on the work surface S in the reclined position by only the second surface 164 of the receptacle protrusion 140 or by only the third surfaces 168 of one or both of the grip protrusions 156.

As shown in FIG. 5B, the control module 100 may also be positioned on a work surface S in a second or upright position. In the upright position, the first surface 160 contacts or engages the work surface S. In the upright position, the front side 128, including the user interface 108, may extend approximately vertically or perpendicularly relative to the work surface.

The control module 100 shown in FIGS. 1-5B provides a support case with high stability when resting on a support surface and increased visibility and accessibility of the user interface 108, as well as ergonomic grips for supporting the control module 100 above a surface.

Figure 6:
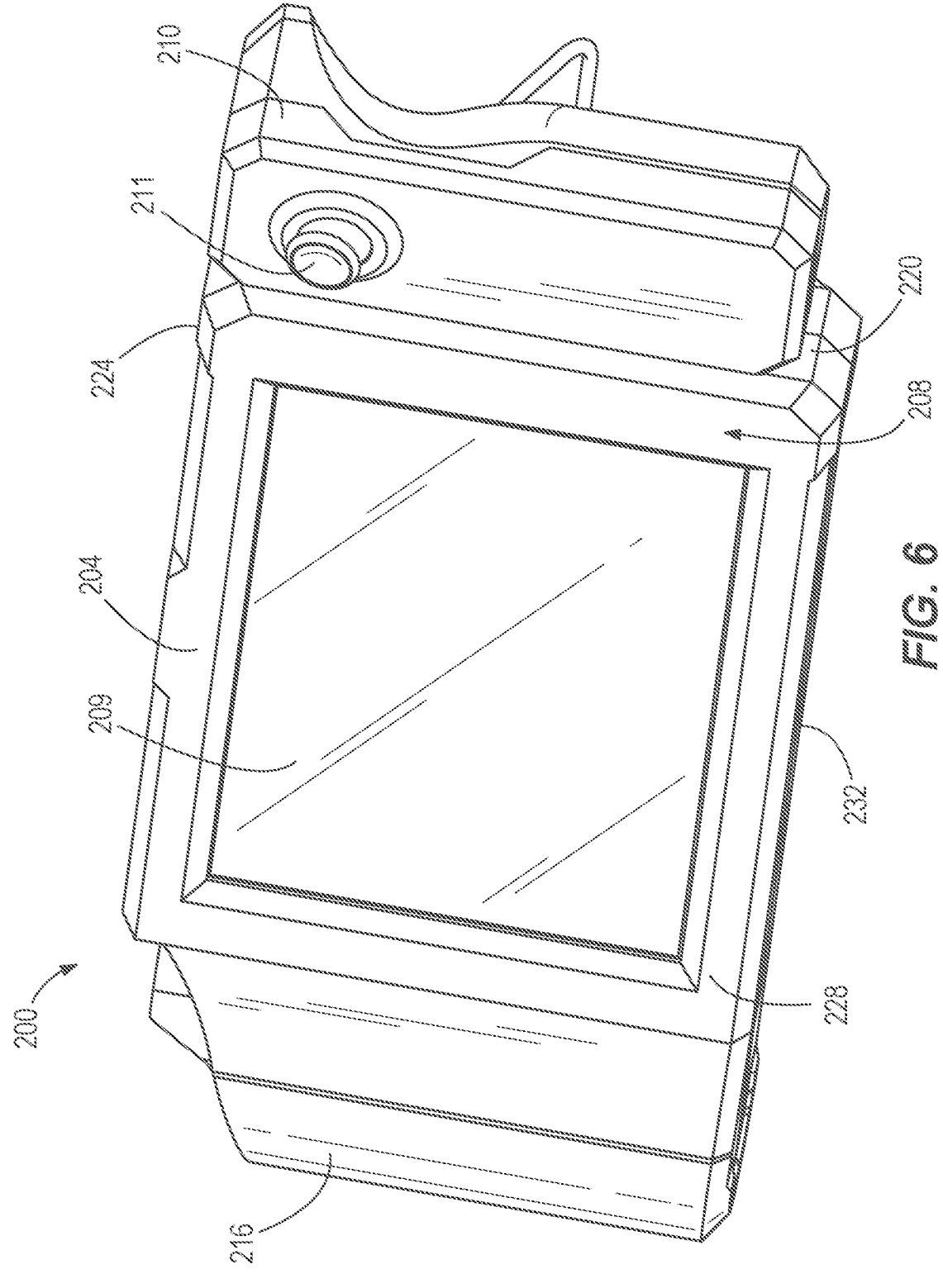
FIG. 6 is a front perspective view of another embodiment of a control module for a borescope.
Figures 7, 8:
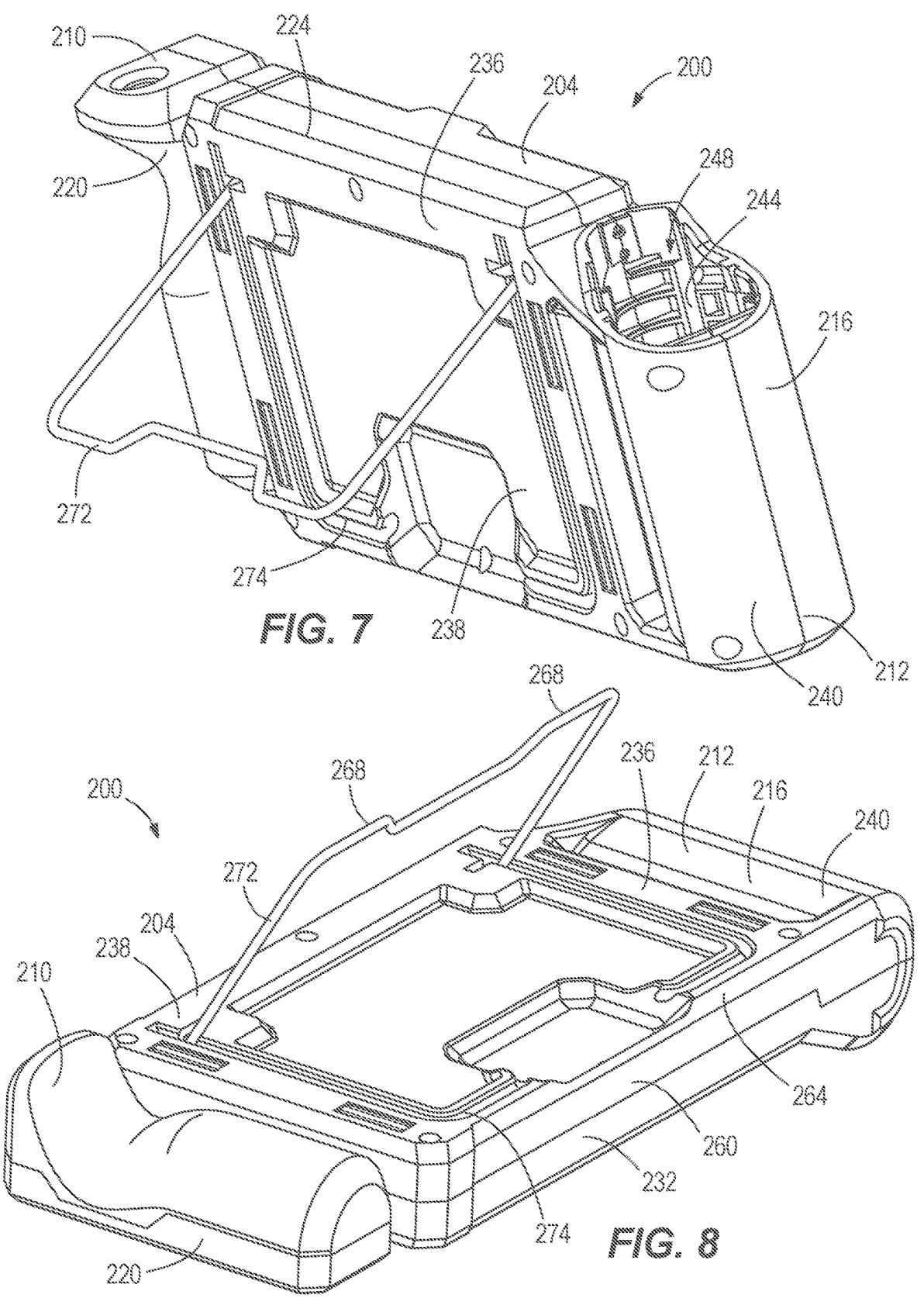
FIG. 7 is a rear perspective view of the control module of FIG. 6.
FIG. 8 is a lower perspective view of the control module of FIG. 6.

FIGS. 6-8 illustrate a second embodiment of a control module 200 of an inspection tool. The control module 200 is generally similar to the control module 100 described above and similar features and described using similar reference numbers plus '100'.

The illustrated control module 200 includes a housing 204 supporting a user interface 208 and a plurality of electronic components configured to control an associated scope unit based on input from the user interface 208. The control module 200 includes a battery receptacle 212 that removably receives and couples to a battery (not shown) to power the electronic components. The battery may be a removable, rechargeable power tool battery. For example, the battery may be a 12-volt Li-ion battery pack. In other embodiments, the battery may have other voltages (e.g., 9-volts, 18-volts, etc.) and/or chemistries (e.g., Ni-MH, etc.). The housing 204 extends between a first side 216 and a second side 220, and includes a top side 224, a front side 228, a bottom side 232, and a rear side 236 extending between the first side 216 and the second side 220. The user interface 208 is supported in the housing 204 on the front side 228 thereof. In the illustrated embodiment, the user interface 208 includes a display 209 with a touch screen having on-screen buttons. The user interface 208 enables the user to control the inspection tool including the associated scope unit. In the illustrated embodiment, the user interface 208 additionally includes a remote 210 with at least one control actuator 211. The remote 210 may be removably attached to the second side 220 of the control module 200. In some embodiments, the remote 210 may be electrically connected to the control module 200 by a cord or wires. In some embodiments, the remote 210 may be wirelessly coupled to the control module 200. In some embodiments, the user interface 208 may additionally include other control actuators (e.g., buttons, switches, etc.) positioned on the housing 204. In such embodiments, the control actuators may be positioned on sides or a rear of the housing 204 alternately or in addition to being positioned on the front side 228. In some embodiments, the control module 200 may also include ports or connectors that allow for the associated scope unit to be connected to the control module 200 by wires or cords.

Turning to FIG. 7, the battery receptacle 212 is positioned on the first side 216 of the control module 200. The first side 216 includes a receptacle protrusion 240 extending out from the housing 204. The receptacle protrusion 240 defines the battery receptacle 212. The battery receptacle 212 includes a channel 244 for at least partially receiving the battery. The channel 244 is accessible through an opening 248 adjacent the top side 224 of the housing 204. A pair of electrical contacts (not shown) may be positioned within the channel 244 and may electrically couple the battery with the internal electronic components of the control module 200 when the battery is received in the channel 244.

With reference to FIGS. 7 and 8, the control module 200 includes a stand 272. In the illustrated embodiment, the stand 272 is a wire stand. The wire stand 272 is pivotally mounted to the rear side 236 adjacent the top side 224. The wire stand 272 is pivotable between a stowed position, where the wire stand 272 is received within a groove 274 or recess 274 on a rear surface 238, and a support position (FIG. 8) in which the wire stand 272 extends at an angle to the rear side 236. The wire stand 272 includes at least one straight portion 268 that extends parallel to the bottom side 232 when the wire stand 272 is in the stowed position.

With reference to FIG. 8, the bottom side 232 of the control module 200 includes a first surface 260 extending from the first side 216 to the second side 220. The first surface 260 is generally flat and extends at least partially under the receptacle protrusion 240. The control module 200 includes a second surface 264 that extends at an edge of the bottom side 232 adjacent the rear side 236. The second surface 264 is angled with respect to the first surface 260. The second surface 264 extends between the first side 216 and the second side 220 including along the receptacle protrusion 240.

Figure 9:
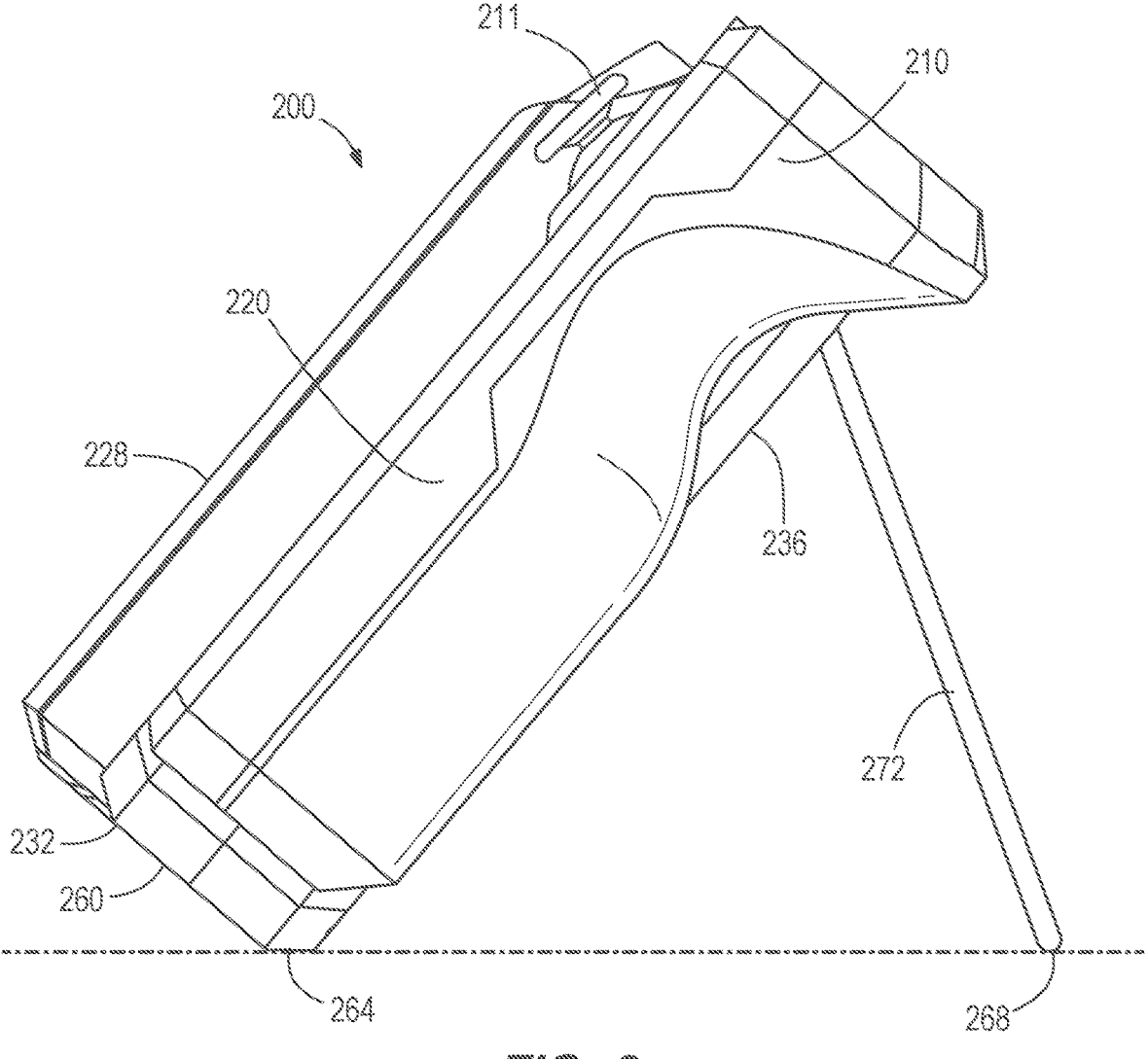
FIG. 9 is a side view of the control module of FIG. 6 in a supported position.

Turning to FIG. 9, the control module 200 may be rested on a work surface, such as a ground, a tabletop, etc. When resting on a work surface, it is desirable for the user interface 208 to remain easily visible or accessible to the user. Additionally, it is desirable for the control module 200 to be stable upon the work surface and to avoid tipping or falling.

As shown in FIG. 9, the control module 200 may be positioned on a work surface S in a reclined position. In the reclined position, the wire stand 272 is pivoted away from the rear surface 238, and the control module 200 is oriented with the second surface 264 and the straight portions 268 of the wire stand 272 contacting the work surface S. In this orientation, the front side 228 of the control module 200 is positioned at an obtuse angle to the work surface S. In other words, the front side 228, including the user interface 208, is tilted upwards, increasing the visibility and accessibility of the user interface 208. In the reclined position, the straight portions 268 of the wire stand 272 are spaced from the second surface 264, widening the base to add stability to the control module 200.

The control module 200 shown in FIGS. 6-9 provides increased stability of the control module 200 and increased visibility and accessibility of the user interface 208.

FIGS. 10-14B illustrate another embodiment of a control module 300 of an inspection tool. The control module 300 is generally similar to the control module 100 described above and similar features and described using similar reference numbers plus '200'.

Figures 10, 11:
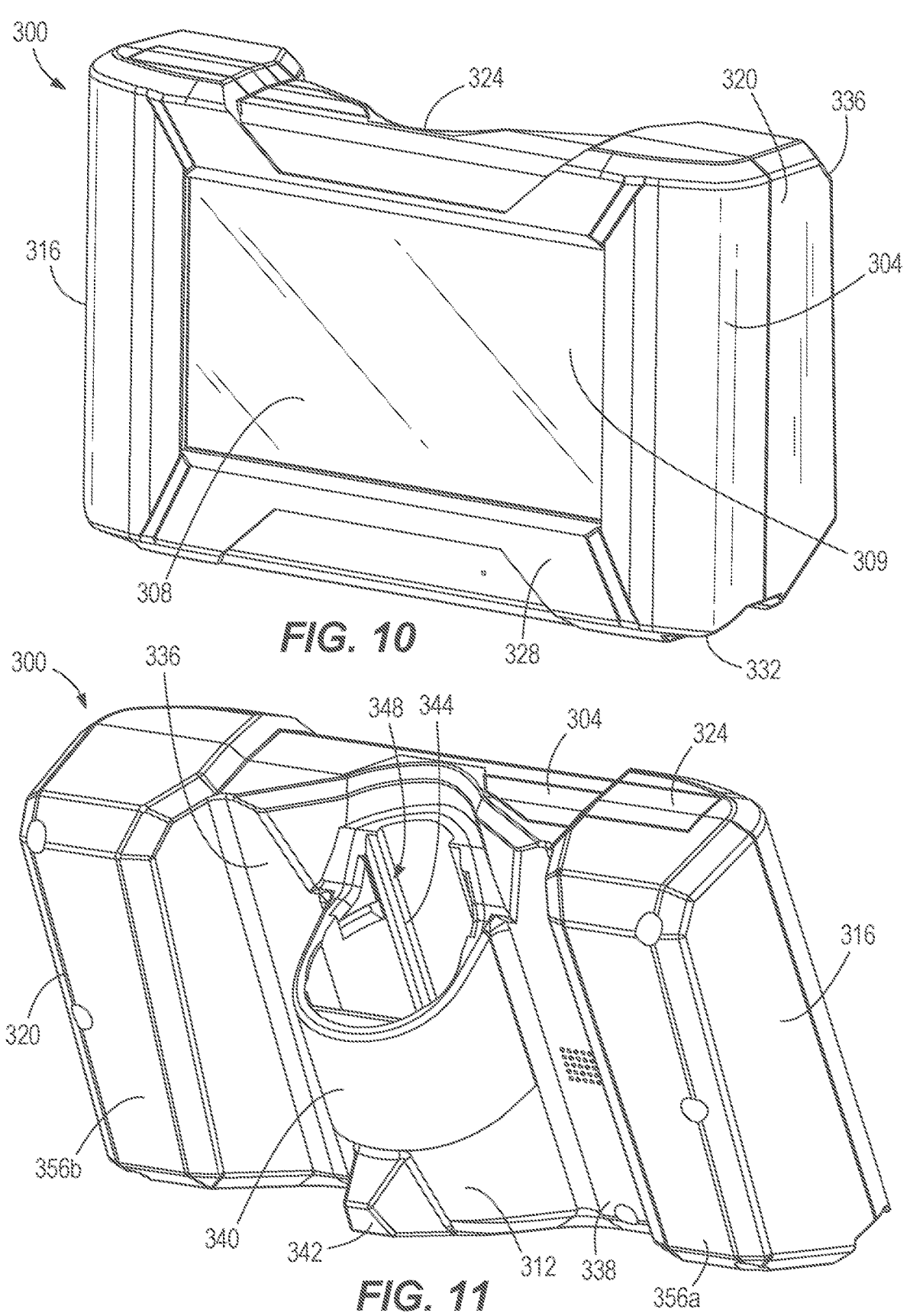
FIG. 10 is a front perspective view of another embodiment of a control module for a borescope.
FIG. 11 is a rear perspective view of the control module of FIG. 10.

With reference to FIG. 10, the control module 300 includes a housing 304 supporting a user interface 308 and a plurality of electronic components configured to control an associated scope unit based on input from the user interface 308. The control module 300 includes a battery receptacle 312 (FIG. 11) that removably couples to a battery to power the electronic components. The battery may be a removable, rechargeable power tool battery. For example, the battery may be a 12-volt Li-ion battery pack. In other embodiments, the battery may have other voltages (e.g., 9-volts, 18-volts, etc.) and/or chemistries (e.g., Ni-MH, etc.). The housing 304 extends between a first side 316 and a second side 320, and includes a top side 324, a front side 328, a bottom side 332, and a rear side 336 extending between the first side 316 and the second side 320. The user interface 308 is supported by the housing 304 on the front side 328 thereof. In the illustrated embodiment, the user interface 308 includes a display 309 having a touch screen with on-screen buttons that allow for a user to control the inspection tool including the associated scope unit. In some embodiments, the user interface 308 may additionally include other control actuators (e.g., buttons, switches, etc.) positioned on the housing 304. In such embodiments, the control actuators may be positioned on sides or a rear of the housing 304 alternately or in addition to being positioned on the front side 328.

The control module 300 is configured to be connected to the scope unit of the inspection tool. In some embodiments, the control module 300 may wirelessly couple to the scope unit and/or other external devices. In such embodiments, the user interface 308 may send and receive signals using a wireless protocol, such as Bluetooth, Wi-Fi, or the like. For example, the control module 300 may wirelessly receive video signals from the scope unit and display the data on the display 309. The control module 300 may also wirelessly send commands (e.g., power commands, lighting commands, pan/zoom/tilt commands, image capture commands, etc.) to the scope unit. In other embodiments, the control module 300 may also include ports or connectors that allow for the associated scope unit and/or other accessories to be physically connected to the control module 300 by wires or cords (e.g., USB Ports, etc.). Alternatively, the scope unit may plug into a dedicated port on the control module 300 (see for example, the embodiment shown in FIGS. 15 and 16). In such embodiments, the user interface 308 may send and receive signals to and from the scope unit through a wired connection. In further embodiments, the user interface 308 may send and receive signals to and from the scope unit using a combination of wireless and wired connections.

Figure 12:
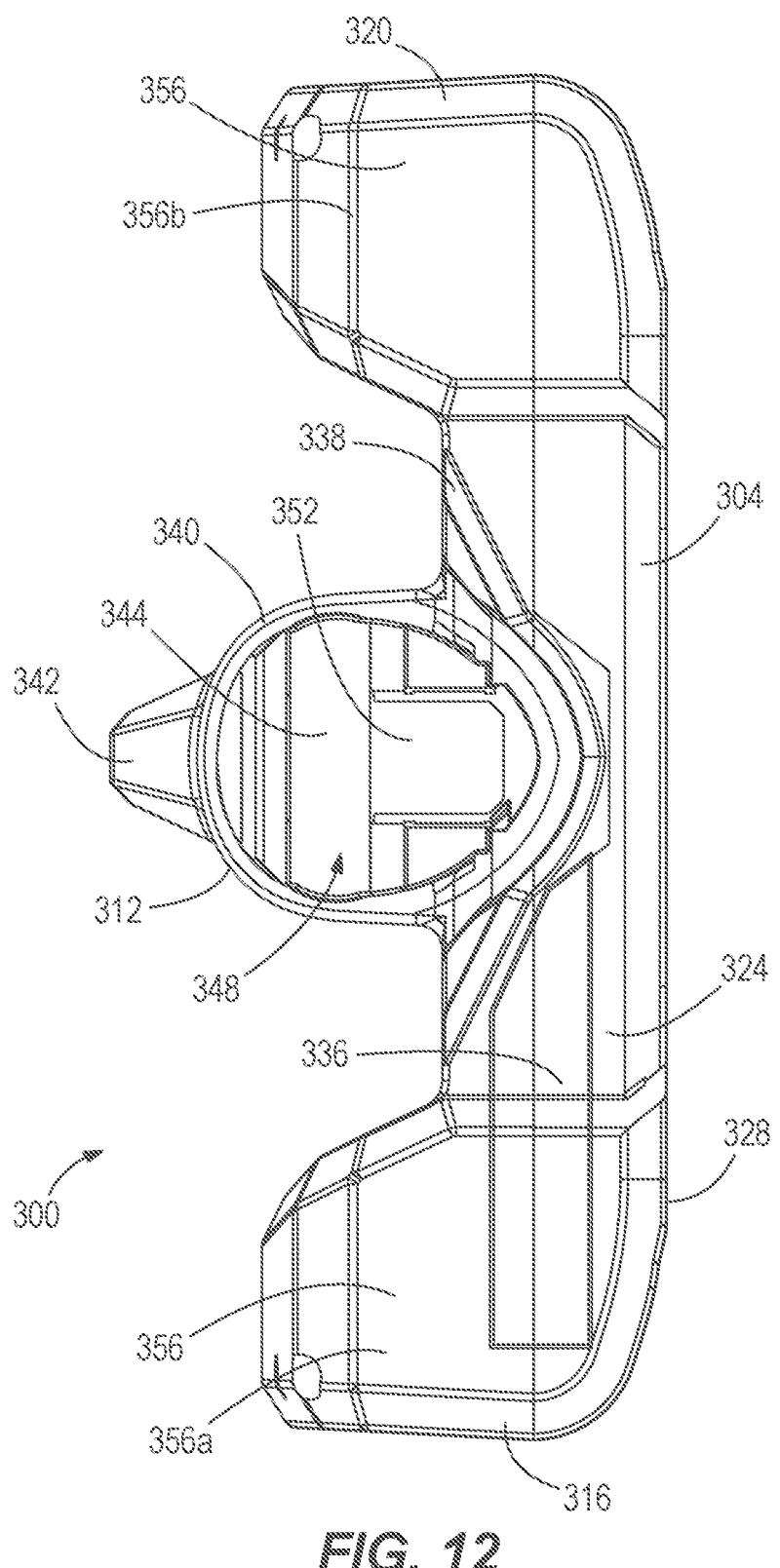
FIG. 12 is a top view of the control module of FIG. 10.

Turning to FIGS. 11 and 12, the battery receptacle 312 is positioned on the rear side 336 of the control module 300. The rear side 336 includes a rear surface 338 and a receptacle protrusion 340 that extends rearwardly from the rear surface 338 and defines the battery receptacle 312. The battery receptacle 312 includes a channel 344 for at least partially receiving the battery. The channel 344 is accessible via an opening 348 adjacent the top side 324 of the housing 304. The battery receptacle 312 includes a pair of electrical contacts 352 (FIG. 12) positioned within the channel 344 that may electrically couple the battery with the internal electronic components of the control module 300 when the battery is received in the channel 344. In the illustrated embodiment, the battery receptacle 312 is centrally located between the first side 316 and the second side 320 of the control module 300. In other words, the battery receptacle 312 is generally disposed adjacent a middle of the rear side 336. In the illustrated embodiment, the receptacle protrusion 340 includes a foot 342 positioned at a lower rear portion of the receptacle protrusion 340. In some embodiments, a portion of the receptacle protrusion 340, including the foot 342, may be removably coupled to the remainder of the receptacle protrusion 340.

With continued reference to FIGS. 11 and 12, the rear side 336 of the housing 304 further includes a pair of hand holds 356, also referred to herein as protrusions 356 or grip protrusions 356, extending rearwardly from the rear surface 338. The grip protrusions 356 are positioned on opposite sides of the receptacle protrusion 340. As shown best in FIG. 12, the receptacle protrusion 340 extends further rearward from the rear surface 338 than the pair of grip protrusions 356. In other embodiments, the grip protrusions 356 may extend further rearward from the rear surface 338 than the receptacle protrusion 340, or the receptacle and grip protrusions 340, 356 may extend generally the same distance from the rear surface 338. The pair of grip protrusions 356 includes a first protrusion 356a adjacent the first side 316 and a second protrusion 356b adjacent the second side 320. The pair of grip protrusions 356 are shaped to facilitate a user grasping one or both of the protrusions 356 in order to support the control module 300 with one or both hands while the user interacts with the user interface 308. In the illustrated embodiment, the grip protrusions 356 include angled or tapered inner sides. In other embodiments, the grip protrusions 356 may have other shapes. The grip protrusions 356 are shaped to be easy to hold in order to improve ergonomics of the case and increase user comfort. In some embodiments, the housing 304 may only include a single grip protrusion 356. For example, the grip protrusion 356 may be positioned on one side of the housing 304, and the receptacle protrusion 340 may be positioned on an opposite side of the housing 304. In such embodiments, the receptacle protrusion 340 may also function as a second grip protrusion.

Figure 13:
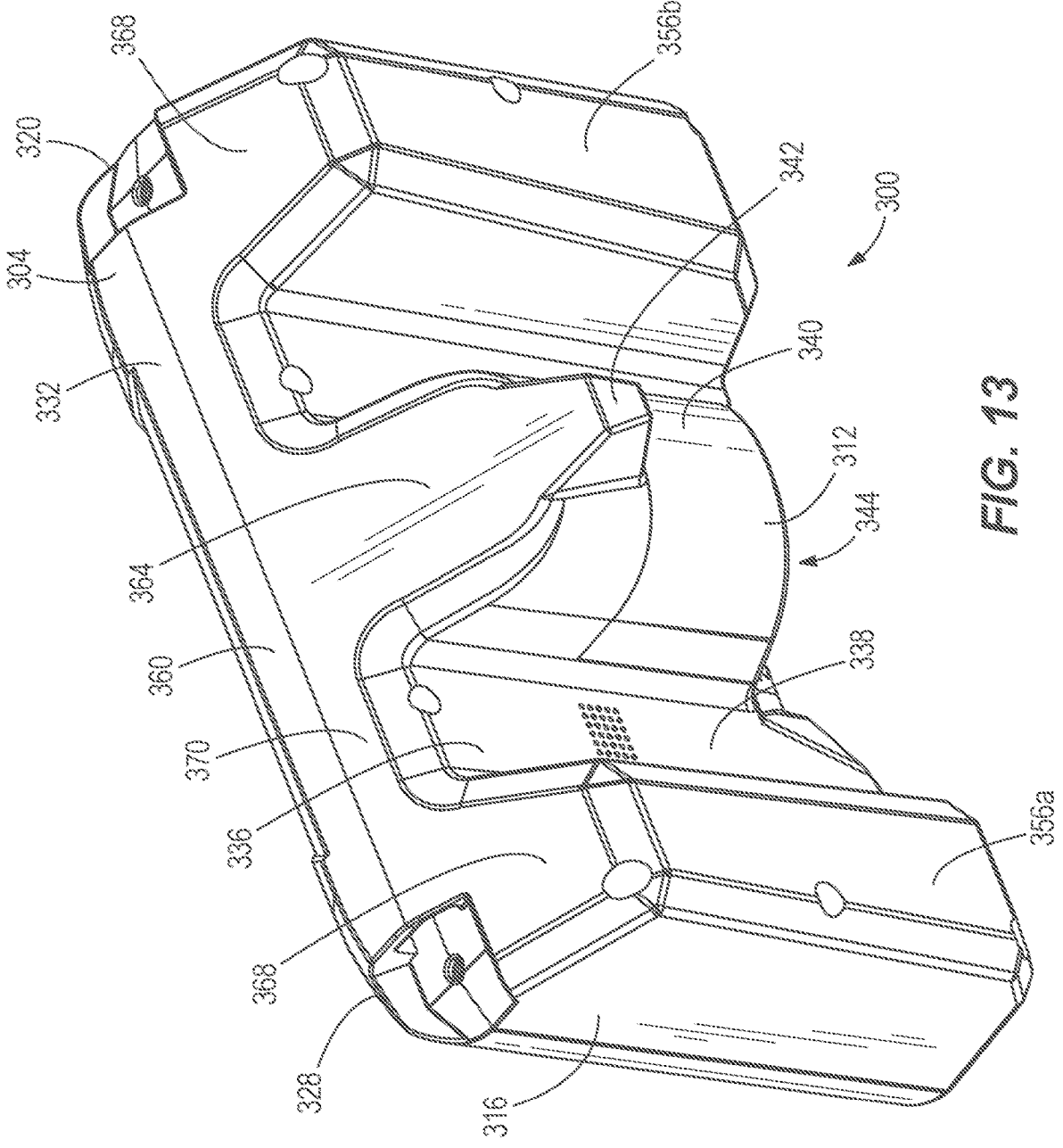
FIG. 13 is a bottom perspective view of the control module of FIG. 10.
Figures 14A, 14B:
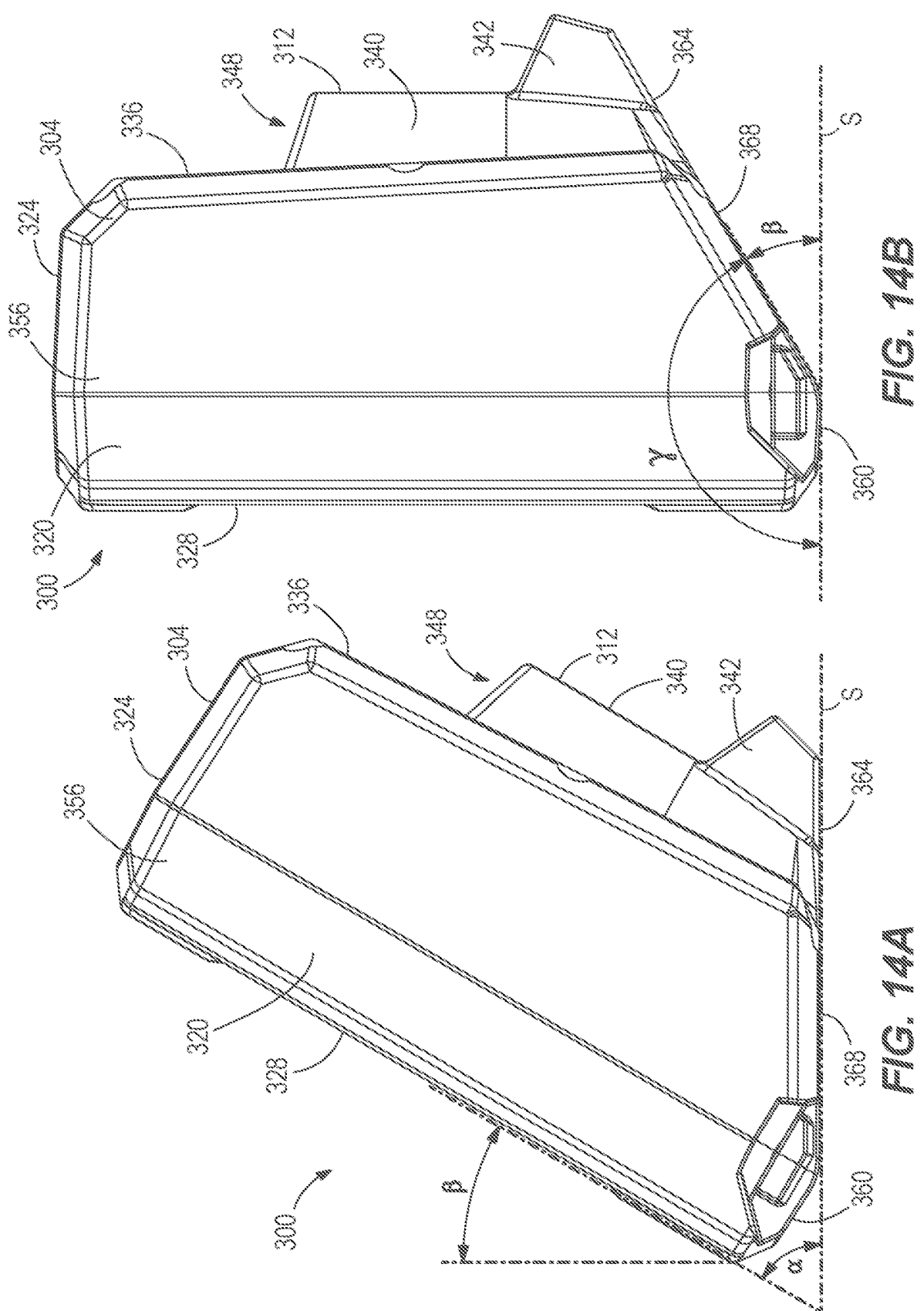
FIG. 14A is a side view of the control module of FIG. 10 in a first supported position.
FIG. 14B is a side view of the control module of FIG. 10 in a second supported position.

With reference to FIG. 13, the bottom side 332 of the control module 300 includes a first surface 360 extending from the first side 316 to the second side 320 and a reclined surface 370. The first surface 360 is generally flat (e.g., planar). The receptacle protrusion 340 includes a second surface 364. The second surface 364 is angled with respect to the first surface 360 by a first angle $\gamma$ (FIG. 14B). The second surface 364 at least partially extends under the receptacle protrusion 340 including under the foot 342. The pair of grip protrusions 356 each include a third surface 368. The third surfaces 368 may be smaller than the second surface 364. Since the second surface 364 is positioned on the receptacle protrusion 340 and the third surfaces 368 are positioned on the grip protrusions 356, the second surface 364 is positioned between the third surfaces 368. Specifically, the third surface 368 of the first protrusion 356a is spaced from the second surface 364 toward the first side 316. The third surface 368 of the second protrusion 356b is spaced from the second surface 364 toward the second side 320. In the illustrated embodiment, the second surface 364 and the third surfaces 368 are parallel and coplanar. In some embodiments, including the illustrated embodiment, the reclined surface 370 may be a single continuous surface that includes the second surface 364, the third surfaces 368, as well as additional bridging surfaces on the bottom side 332 of the housing 304. In other embodiments, the reclined surface may be non-continuous (e.g., similar to the embodiment shown in FIGS. 1-5B).

With reference to FIGS. 14A and 14B the control module 300 may be rested on a work surface, such as a ground, a tabletop, etc. When resting on a work surface, it is desirable for the user interface 308 to remain easily visible or accessible to a user. Additionally, it is desirable for the control module 300 to be stable upon the work surface and to avoid tipping or falling. In embodiments where a scope unit or other components are connected to the case via cords, there may be pulling or tipping forces applied to the control module 300 which the control module 300 needs to withstand to avoid tipping or unwanted displacement of the control module 300.

As shown in FIG. 14A, the control module 300 may be positioned on a work surface S in a first or reclined position. In the reclined position, the control module 300 is supported by the reclined surface 370 and thus is oriented with the second surface 364 and the third surfaces 368 contacting the work surface S. In this orientation, the control module 300 is reclined so that the front side 328 and the user interface 308 is positioned at an acute angle to the work surface S supporting the control module 300. In the illustrated embodiment, the front side 328 of the control module 300 is at an angle $\alpha$ with respect to the work surface S. The angle $\alpha$ may be between 45 degrees and 75 degrees. More specifically, the angle $\alpha$ may be 60 degrees. In other words, the display 309 is at an angle $\beta$ of 30 degrees with respect to vertical. Thus, the front side 328, including the user interface 308, is facing upwards, increasing the visibility of the user interface 308. As discussed above, the third surfaces 368 are spaced from the second surface 364 to widen the support area and add stability to the control module 300 in the reclined position. In some embodiments, the reclined surface 370 may omit the second surface 364 or the third surfaces 368 and the control module 300 may be supported by the remaining portions of the reclined surface 370.

As shown in FIG. 14B, the control module 300 may also be positioned on a work surface S in a second or upright position. In the upright position, the first surface 360 contacts the work surface S. In the upright position, the front side 328, including the user interface 308, may extend vertically, or generally perpendicular to the work surface.

The control module 300 shown in FIGS. 10-14B provides increased stability of the control module 300 in the reclined position and increased visibility and accessibility of the user interface 308, as well as increased ergonomics for supporting the control module 300 above the surface.

Figures 15, 16:
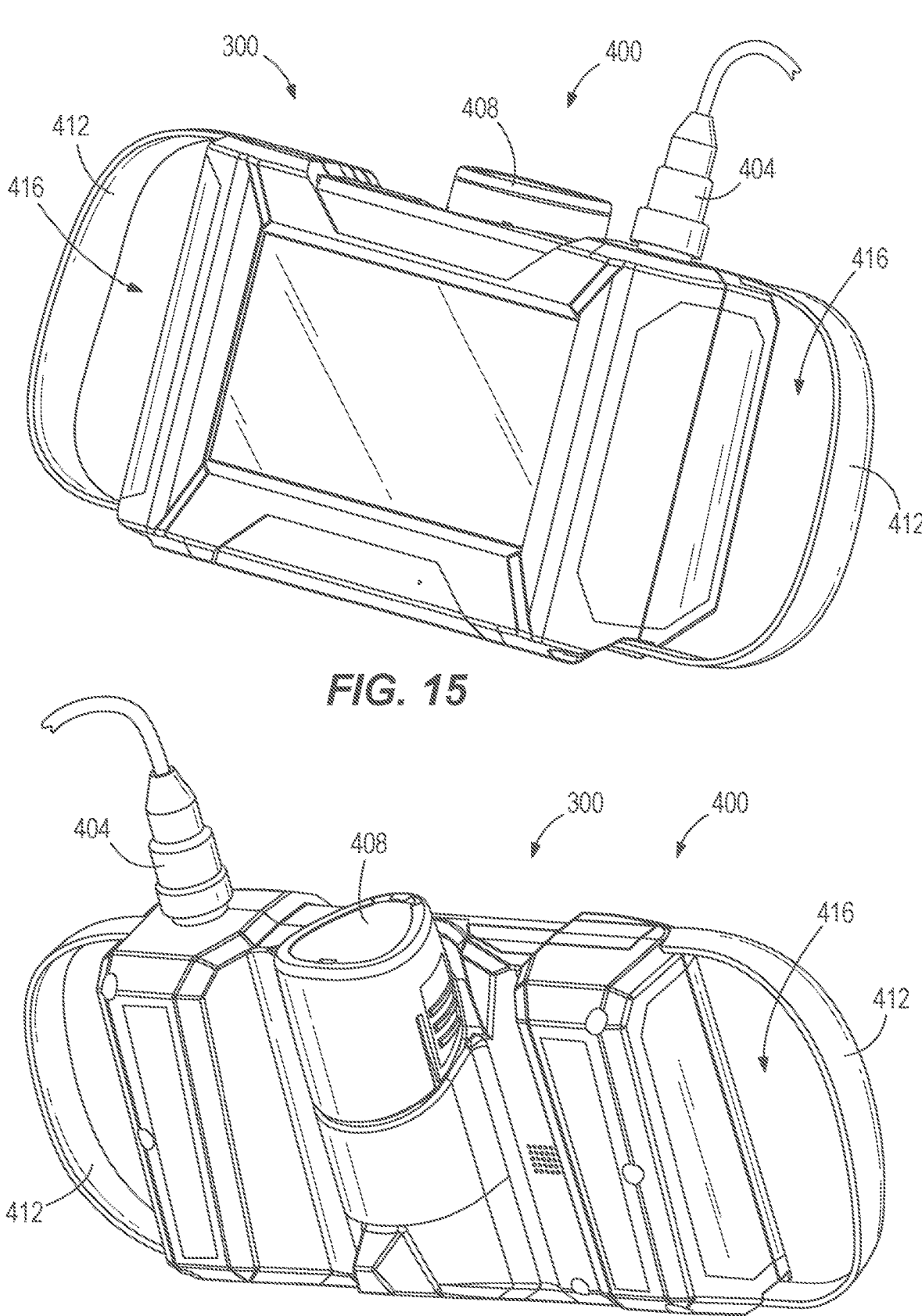
FIG. 15 is a front perspective view of the control module of FIG. 10 with a pair of straps.
FIG. 16 is a rear perspective view of the control module of FIG. 15.

FIGS. 15 and 16 illustrate an inspection tool 400 in operation including the control module 300 and a scope unit 404. The control module 300 is physically coupled to the scope unit 404. The scope unit 404 includes a head (not shown) having at least one camera for capturing images. A battery 408 is coupled to the control module 300 within channel 344. The control module 300 further includes a pair of straps 412 coupled to each of the grip protrusions 356. The straps 412 may be formed from a flexible material and may form a loop extending out from the sides of the control module 300. Each strap 412 may define a receiving area 416 configured to receive a user's hand. In other embodiments, the straps 412 may be positioned in different ways or used in other configurations. In some embodiments, the straps 412 may make one-handed support of the control module 300 easier. In the illustrated embodiment, the straps 412 are fixedly coupled to the top of the grip protrusions 356 and are movably and/or removably coupled to the bottom of the grip protrusion 356 to adjust the size of the receiving area 416 and the length of the straps 412. The extra length of strap (i.e., slack) may be positioned within the control module 300. In other embodiments, other fastening methods may be used. For example, in some embodiments the strap may include a plurality of apertures that couple to posts positioned on the control module 300.

In operation, a user may position their hand so that the fingers are positioned between the receptacle protrusion 340 and the grip protrusion 356. The palm of the user's hand may contact the side surface of the control module 300. The user's hand may surround a majority of an outer surface of the protrusion 356. The strap 412 may cross along the back of the user's hand to increase the security of the user's grip on the grip protrusion 356.

Although illustrated with the control module 300 of FIGS. 10-14B, the straps 412 may be also be used with the control module 100 of FIGS. 1-5B or the control module 200 of FIGS. 6-9.

Figure 17:
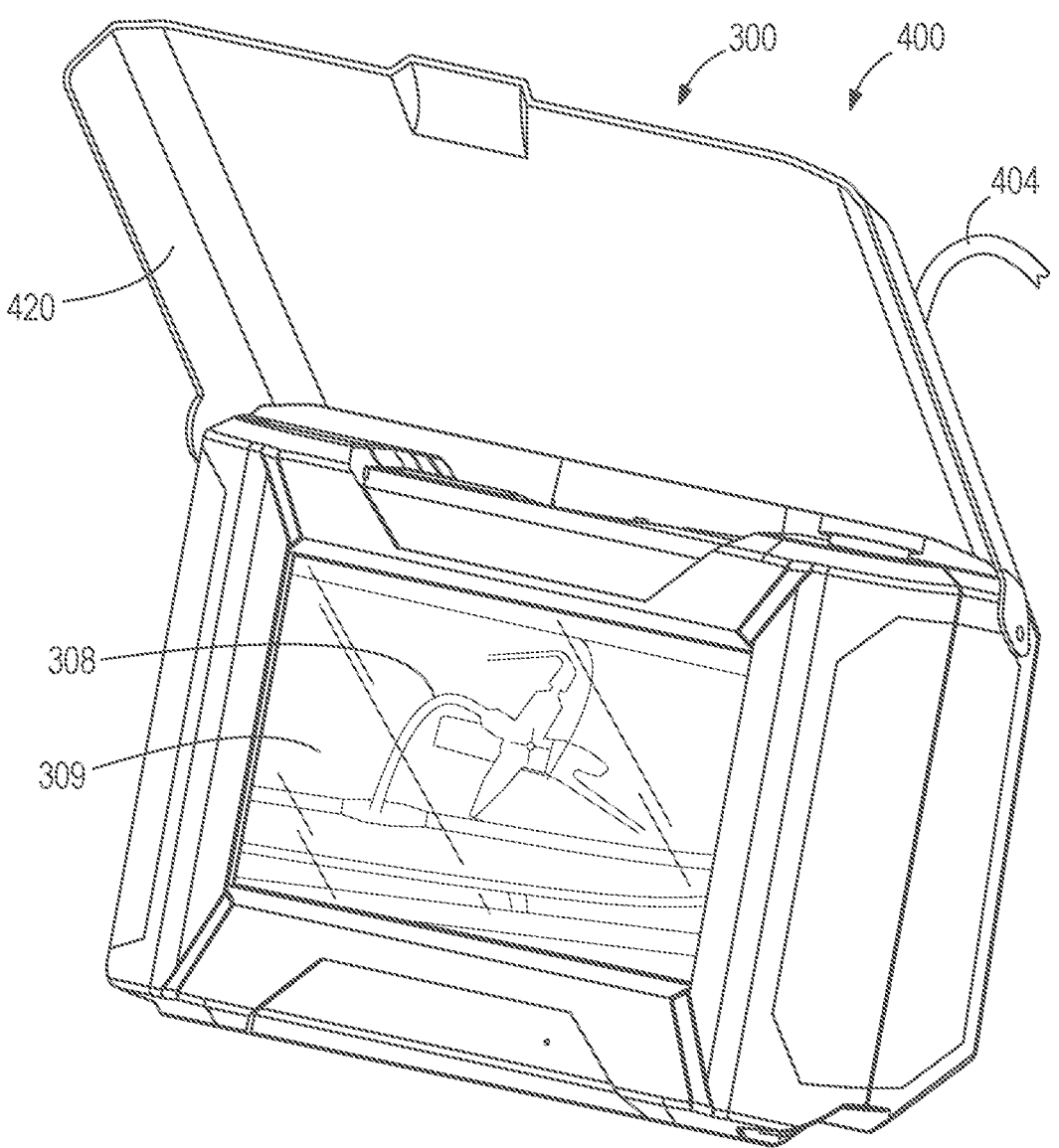
FIG. 17 is a front perspective view of the control module of FIG. 10 with a cover.

FIG. 17 illustrates a further configuration of the inspection tool 400 with the straps 412 removed and including the control module 300 and a cover 420. The control module 300 may detachably couple to the cover 420. The cover 420 is movable to selectively cover at least a portion of the user interface 308. In the illustrated embodiment, the cover 420 is rotatable between a closed position, in which the cover 420 is adjacent the front side 328 and overlies the display 309, and an open position (as shown) in which the display 309 is visible and the front side 328 is shaded from any bright light by the cover 420. In some embodiments, the control module 300 may include both the straps 412 and the cover 420.

Although illustrated with the control module 300 of FIGS. 10-14B, the cover 420 may also be used with the control module 100 of FIGS. 1-5B or the control module 200 of FIGS. 6-9.

Thus, the disclosure provides several embodiments of support cases for an inspection tool such as a borescope with improved stability, ergonomics, and visibility. Features of the embodiments can be combined without departing from the spirit of the invention.

Although the invention has been described in detail with reference to certain preferred embodiments, variations and modifications exist within the scope and spirit of one or more independent aspects of the invention as described.

Various features and advantages of the invention are set forth in the following claims.

What is claimed is:

1. A hand-held control module of an inspection tool, the hand-held control module comprising:
   a housing extending between a first side and a second side and including a first surface at a bottom side thereof;
   a pair of grip protrusions, each grip protrusion having a second surface inclined with respect to the first surface by a first angle;
   a battery receptacle configured to receive a battery, positioned between the pair of grip protrusions, having a third surface inclined with respect to the first surface by the first angle, and having an opening opposite the third side through which the battery is received; and
   a user interface supported by the housing and operable to control the inspection tool;
   wherein the hand-held control module is configured to be supported on a work surface in a reclined position in which the second surfaces of the pair of grip protrusions and the third surface of the battery receptacle engage the work surface.

2. The hand-held control module of claim 1, wherein in the reclined position the first surface is spaced from the work surface.

3. The hand-held control module of claim 1, wherein in the reclined position the user interface is tilted back to form an acute angle with the work surface.

4. The hand-held control module of claim 1, wherein the hand-held control module is further configured to be supported on the work surface in an upright position in which the first surface engages the work surface and the second surfaces are spaced from the work surface.

5. The hand-held control module of claim 1, wherein the pair of grip protrusions is a pair of hand holds configured to be engaged by hands of a user to support the hand-held control module above the work surface.

6. The hand-held control module of claim 5, wherein one of the pair of hand holds is disposed adjacent the first side of the housing and another of the pair of hand holds is disposed adjacent the second side of the housing.

7. The hand-held control module of claim 6, wherein the battery receptacle is disposed on a rear side of the housing.

8. The hand-held control module of claim 1, wherein the battery receptacle further includes a foot and the third surface extends at least partially under the foot.

9. The hand-held control module of claim 1, wherein the third surface and the second surfaces are coplanar and cooperate to form a reclined surface.

10. The hand-held control module of claim 1, further comprising a pair of straps, each of the pair of straps coupled to one of the pair of grip protrusions, and wherein the pair of straps is configured to couple the hand-held control module to one or both hands of a user.

11. A control module of an inspection tool, the control module comprising:
   a housing extending between a first side and a second side, the housing including a first surface at a bottom side thereof;
   a battery receptacle disposed at a rear side of the housing, centrally located between the first side and the second side, and configured to receive a battery, the battery receptacle having a second surface inclined with respect to the first surface by a first angle; and
   a user interface supported by the housing and operable to control the inspection tool;
   wherein the control module is configured to be supported on a work surface in a reclined position in which the second surface engages the work surface,
   wherein the battery receptacle includes a channel for receiving the battery, and wherein the channel is accessible through an opening opposite the second surface.

12. The control module of claim 11, wherein the battery receptacle includes a foot extending rearwardly therefrom, and wherein the second surface extends at least partially under the foot.

13. The control module of claim 11, further comprising a pair of grip protrusions, each grip protrusion having a third surface, and wherein the third surfaces of the pair of grip protrusions are coplanar with the second surface and engage the work surface in the reclined position.

14. The control module of claim 13, further comprising a pair of straps, each of the pair of straps coupled to one of the pair of protrusions, and wherein the pair of straps is configured to couple the control module to one or both hands of a user.

15. The control module of claim 11, further comprising a cover coupled to the housing for movement between a closed position, in which the cover covers the user interface, and an open position, in which the cover shades the user interface.

16. An inspection tool comprising:

a scope unit; and a hand-held control module operable to control the scope unit, the hand-held control module including a housing extending between a first side and a second side, the housing including a first surface at a bottom side thereof, a battery receptacle disposed at a rear side of the housing and configured to receive a battery, the battery receptacle having a second surface inclined with respect to the first surface by a first angle and an opening opposite the second surface through which the battery is received, a pair of grip protrusions spaced apart from and on opposing sides of the battery receptacle, each grip protrusion having a third surface inclined with respect to the first surface by the first angle, and a user interface supported by the housing and configured to control the scope unit;

wherein the hand-held control module is configured to be supported on a work surface in a reclined position in which the second surface of the battery receptacle and third surfaces of the pair of grip protrusions engage the work surface and the user interface is tilted backwards relative to vertical.

17. The inspection tool of claim 16, wherein one of the pair of grip protrusions is disposed adjacent the first side of the housing and another of the pair of grip protrusions is disposed adjacent the second side of the housing.

18. The inspection tool of claim 16, wherein the scope unit is physically coupled to the hand-held control module, wherein in the reclined position the second surface and third surfaces cooperate to form a reclined surface, and wherein the reclined surface creates a stable base configured to withstand tipping forces applied to the hand-held control module by the scope unit.

* * * * *